(12) United States Patent
Inujima et al.

(10) Patent No.: US 6,652,160 B2
(45) Date of Patent: Nov. 25, 2003

(54) TRANSMISSION OPTICAL MODULE

(75) Inventors: Takayoshi Inujima, Yokohama (JP); Eiji Tsumura, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 16 days.

(21) Appl. No.: 10/122,720

(22) Filed: Apr. 16, 2002

(65) Prior Publication Data

US 2002/0159722 A1 Oct. 31, 2002

(30) Foreign Application Priority Data

Apr. 26, 2001 (JP) ................................. P2001-129714

(51) Int. Cl.[7] ................................................ G02B 6/36
(52) U.S. Cl. .............................. 385/92; 385/88; 385/14; 257/99
(58) Field of Search .......................... 385/88–94, 49, 385/14; 257/98–100, 84, 85

(56) References Cited

U.S. PATENT DOCUMENTS

| | | | |
|---|---|---|---|
| 5,170,453 A | | 12/1992 | Go et al. |
| 6,038,203 A | * | 3/2000 | Tajiri et al. ............... 369/112.1 |
| 6,234,686 B1 | * | 5/2001 | Tonai et al. ................... 385/88 |
| 6,332,720 B1 | * | 12/2001 | Shimaoka et al. ............ 385/88 |
| 6,335,548 B1 | * | 1/2002 | Roberts et al. ............... 257/98 |
| 6,394,664 B1 | * | 5/2002 | Isaksson ....................... 385/88 |
| 2002/0168152 A1 | * | 11/2002 | Abe et al. ..................... 385/88 |

* cited by examiner

*Primary Examiner*—Hemang Sanghavi
(74) *Attorney, Agent, or Firm*—McDermott, Will & Emery (57) ABSTRACT

A light-emitting device assembly in the transmission optical module in accordance with the present invention accommodates a light-emitting device in a case, whereas a connection pin electrically connected to the anode of the light-emitting device extends outward from the case. The module also has a circuit board on which an electronic device for controlling the light-emitting device is mounted, whereas the circuit board is mounted in a board mounting part of a lead frame. The circuit board is provided with a first pad to which a predetermined potential is applied, and a second pad for supplying a source voltage, whereas wires bonding the connection pin to the first and second pads respectively.

3 Claims, 6 Drawing Sheets

TRANSMISSION OPTICAL MODULE

BACKGROUND OF THE INVENTION

1. Field of the Invention

The present invention relates to a transmission optical module used in optical link apparatus for data communications and the like.

2. Related Background Art

Transmission optical modules for converting electric signals into optical signals and sending out optical signals thus obtained to optical fibers have widely been use in optical communication systems such as data links and optical LANs using light as their information transmitting medium.

Figure 8:
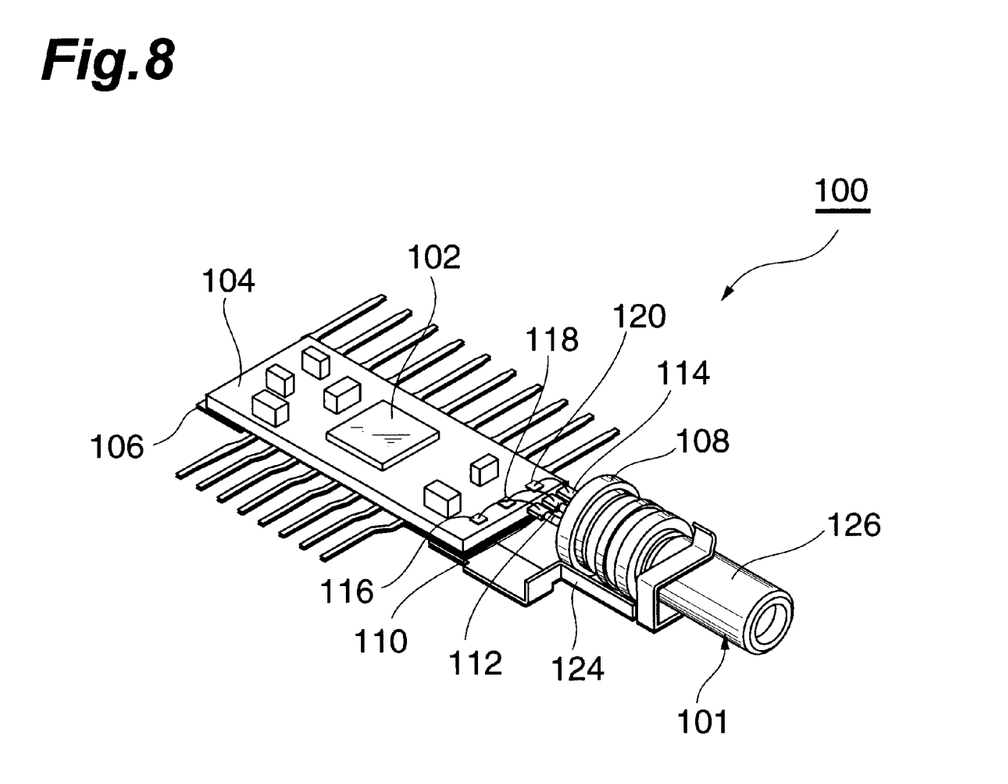
FIG. 8 is a perspective view showing the inner structure of a conventional transmission optical module.

As shown in FIG. 8, a transmission optical module 100 comprises, within a mold resin, a light-emitting device assembly 101 incorporating a light-emitting device therein, a circuit board 104 on which an electronic device 102 for controlling the light-emitting device incorporated in the light-emitting device assembly 101 is mounted, and a lead frame 106 for mounting the circuit board 104. A plurality of connection pins 110 to 114 extend from a base 108 of the light-emitting device assembly 101. Among these connection pins 110 to 114, wires bond between the connection pin 112 connected to the anode of the light-emitting device and an anode pad 118 on the circuit board 104, and between the connection pin 110 connected to the cathode of the light-emitting device and a cathode pad 116 on the circuit board 104.

In such a conventional transmission optical module 100, a holding member 124 extending from the lead frame 106 holds the light-emitting device assembly 101 with a sleeve 126, whereby a source voltage is supplied to the light-emitting device within the light-emitting device assembly 101 through a path comprising the lead frame 106, holding member 124, sleeve 126, and light-emitting device in series.

SUMMARY OF THE INVENTION

The waveform of signal light outputted from the above-mentioned conventional transmission optical module, however, has not fully been stable. Therefore, it is an object of the present invention to provide a transmission module which can stabilize the waveform of signal light outputted therefrom.

The transmission optical module in accordance with the present invention comprises (1) a light-emitting device assembly having a light-emitting device, a case for accommodating the light-emitting device, and a connection pin extending outward from the case and electrically connected to an anode of the light-emitting device; (2) a circuit board, on which an electronic device for controlling the light-emitting device is mounted, and having a first pad to which a predetermined potential is applied and a second pad for supplying a source voltage; (3) a lead frame having a board mounting part for mounting the circuit board; and (4) wires bonding the connection pin to the first and second pads respectively.

This transmission optical module can stabilize the waveform of signal light outputted therefrom.

In the transmission optical module in accordance with the present invention, the source voltage may be supplied from the second pad alone. This can further stabilize the waveform of signal light outputted from the light-emitting device.

Preferably, in the transmission optical module in accordance with the present invention, the light-emitting device assembly, circuit board, and lead frame are encapsulated with a resin.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 is an exploded perspective view showing the overall structure of a transmission optical module in accordance with the present invention, whereas

DESCRIPTION OF THE PREFERRED EMBODIMENTS

In the following, a preferred embodiment of the transmission optical module in accordance with the present invention will be explained with reference to the accompanying drawings. To facilitate the comprehension of the explanation, the same reference numerals denote the same parts, where possible, throughout the drawings, and a repeated explanation will be omitted.

Figure 1:
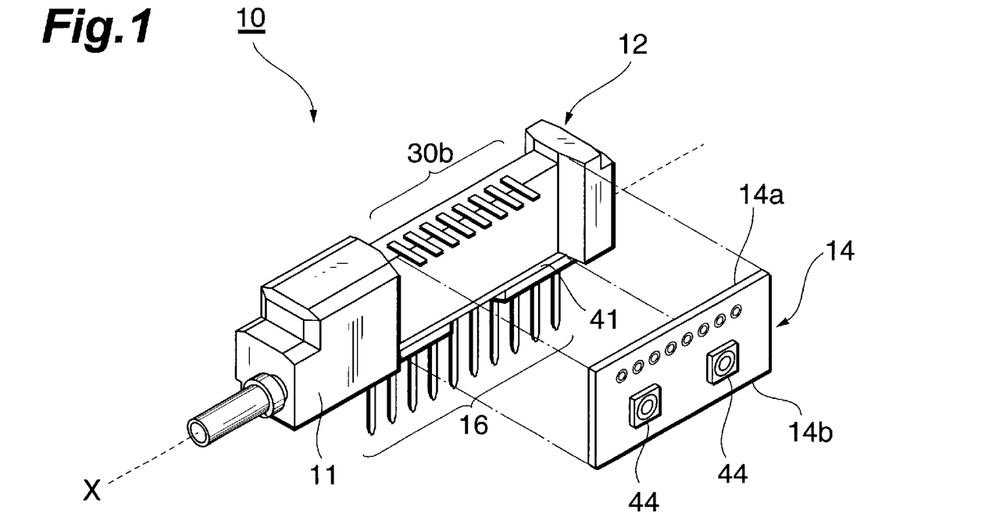

FIG. 1 is an exploded perspective view of the transmission optical module 10 in accordance with this embodiment. As shown in FIG. 1, the transmission optical module 10 comprises an optical module body 12, and an external board 14 mounted with volumes 44 acting as variable resistors for adjusting electric characteristics of the optical module 12, whereas the external board 14 is secured to a side face of the optical module body 12.

As shown in FIG. 1, the optical module body 12 has a structure of SIP (Single Inline Package) type having an exterior substantially shaped like a square pole with a bottom face from which a first lead array 16 projects. First, for convenience of explanation, the inner configuration of the optical module 12 will be explained.

Figure 2:
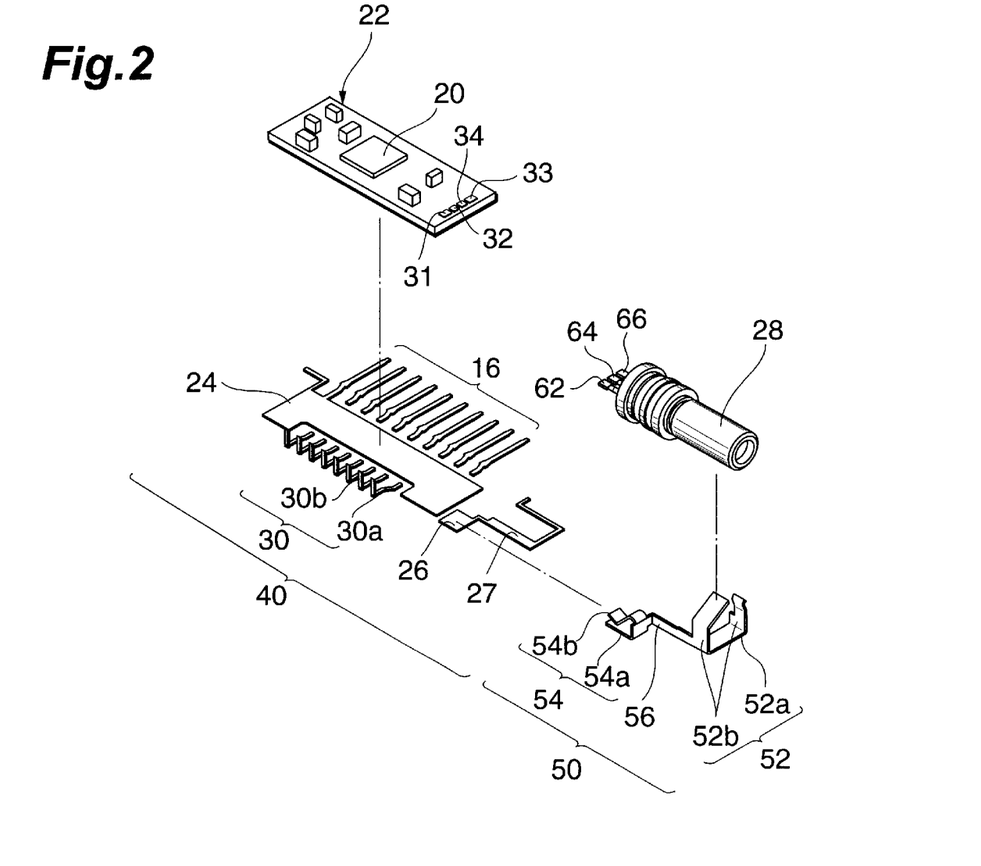
FIG. 2 is an exploded perspective view showing the inner structure thereof.

FIG. 2 is a perspective view showing the inner configuration of the optical module body 12. As shown in FIG. 2, the optical module body 12 comprises, within a mold resin (11 in FIG. 1), a light-emitting device assembly 28 incorporating therein a light-emitting device 17 for converting an electric signal into an optical signal; an electronic device 20 for controlling the light-emitting device 17; an internal board (circuit board) 22 for mounting the electronic device 20; a lead frame 40 having an island (board mounting part) 24 for mounting the internal board 22, the first lead array 16, a second lead array 30, and a support part 26; and a holding member 50 for holding the light-emitting device assembly 28.

The island 24, first lead array 16, second lead array 30, and support part 26 constituting the lead frame 40 are disposed on a reference plane including the island 24. The first lead array 16 is constituted by ten lead pins, and is connected to a mount board, which is not depicted, thus making it possible to transmit electric signals between the optical module body 12 and the outside. On the other hand, the second lead array 30 is constituted by eight lead pins, and is connected to the external board 14, thus making it possible to transmit electric signals between the optical module body 12 and the external board 14. The first lead array 16 extends along the reference plane including the island 24, whereas the second lead array 30 has a base part 30a extending along the reference plane and a bent part 30b bent at a predetermined angle with respect to the base part 30a.

As shown in FIG. 2, the lead frame 40 has the support part 26, separated from the island 24, for supporting the holding member 50, and an auxiliary part 27 for assisting in supporting the holding member 50. The auxiliary part 27 is constituted by a frame-like member having one end connected to the support part 26. The support part 26 and auxiliary part 27 are disposed on the reference plane including the island 24, as with the other members constituting the lead frame 40.

Preferably, the lead frame 40 is formed from a metal excellent in heat dissipation, such as a Cu alloy. For enhancing corrosion resistance and soldering characteristics, it is preferred that the lead frame 40 be plated with Ni, Ni/Au, Ni/Pd, Ni/Pd/Au, or the like. In this embodiment, the potential of the island 24 is maintained at $V_{CC}$.

Figure 3:
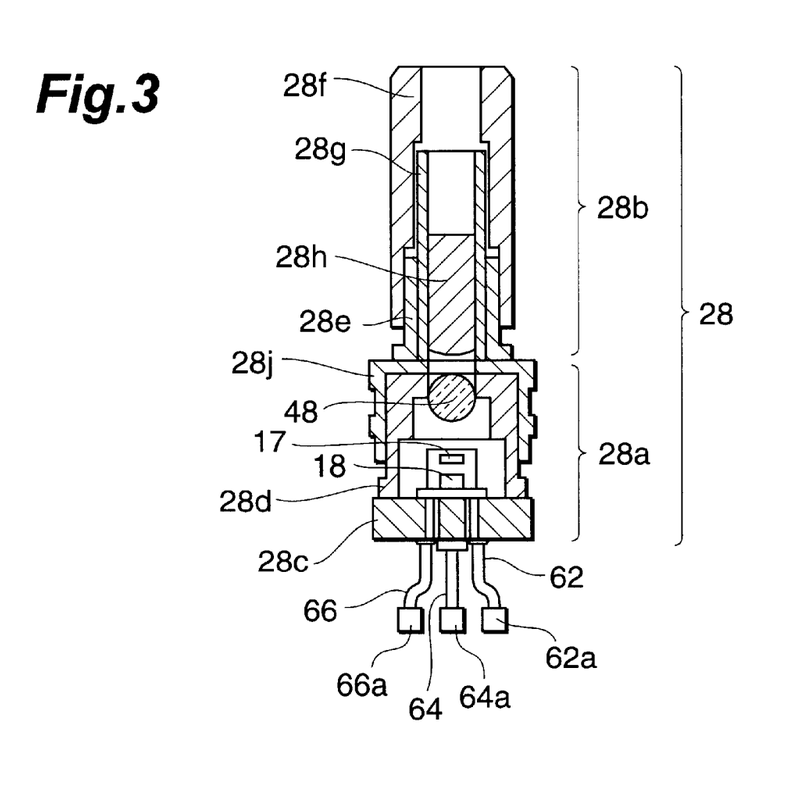
FIG. 3 is a sectional view showing the structure of the light-emitting device assembly in the optical module of FIG. 1.

As shown in FIG. 3, the light-emitting device assembly 28 has a device accommodating part (case) 28a and a guide part 28b. The device accommodating part 28a incorporates therein the light-emitting device 17, e.g., light-emitting diode and semiconductor laser, and a photodiode 18 for monitoring the light-emitting device 17. The device accommodating part 28 has a base 28c formed from a metal material such as covar. Mounted on the base 28c is a lens cap 28d made of a metal material such as stainless steel. The device accommodating part 28a has a window 48 formed in the lens cap 28d. The window 48, through which light associated with the light-emitting device 17 is transmittable, can include a condenser lens. The lens cap 28d is inserted into a holder 28j made of a metal material such as stainless steel. A plurality of connection pins 62 to 66 extend outward from the base 28c. Among the connection pins 62 to 66, connection pin 62 is electrically connected to the cathode of the light-emitting device 17, connection pin 64 is electrically connected to the anode of the light-emitting device 17 and the cathode of the photodiode 18, and connection pin 66 is electrically connected to the anode of the photodiode 18. Flat parts 62a to 66a are formed at respective end parts of the connection pins 62 to 66 by lead forming, so as to attain a shape suitable for wire bonding.

The guide part 28b has a guide member 28e made of a metal material such as stainless steel. The guide member 28e is secured onto the holder 28j. A sleeve 28f made of a metal material such as stainless steel is disposed outside the guide member 28e. A split sleeve 28g formed from a material such as zirconia is accommodated within the guide member 28e. The split sleeve 28g positions a stub 28h in which an optical fiber is accommodated.

The electronic device 20 is a signal processing device for subjecting received signals to a predetermined processing operation and outputting thus processed signals, e.g., a device incorporating therein a driving circuit for driving the light-emitting device 17 included in the light-emitting device assembly 28. As shown in FIG. 2, the electronic device 20 is mounted on the internal board 22 constituted by a ceramic multilayer wiring board and the like, whereas the internal board 22 is mounted on the island 24 of the lead frame 40. Disposed on the internal board 22 are a pad 31 for establishing electric connection with the cathode of the light-emitting device 17, a pad (first pad) 32 for establishing electric connection with the anode of the light-emitting device 17 and the cathode of the photodiode 18, and a pad 33 for establishing electric connection with the anode of the photodiode 18, which are maintained at their respective predetermined potentials. Also, a pad (second pad) 34 for supplying a source voltage to the light-emitting device 17 is disposed on the internal board 22.

The holding member 50 has a holding part 52 for holding the light-emitting device assembly 28, and a grasping part 54 for grasping the support part 26 of the lead frame 40. The holding part 52 includes a base portion 52a adapted to abut against the side face of the sleeve 28f of the light-emitting device assembly 28, and surrounding portions 52b, bent at both ends of the base portion 52a, for surrounding the sleeve 28f. The grasping part 54 for grasping the holding part 26 of the lead frame 40 has a base portion 54a, and a pressing portion 54b for urging the support part 26 toward the base portion 54a. The holding part 52 and the grasping part 54 are connected to each other with a connecting part 56. Here, materials such as phosphor bronze, nickel silver, and SUS are suitable as the material for the holding member 50.

Figure 4:
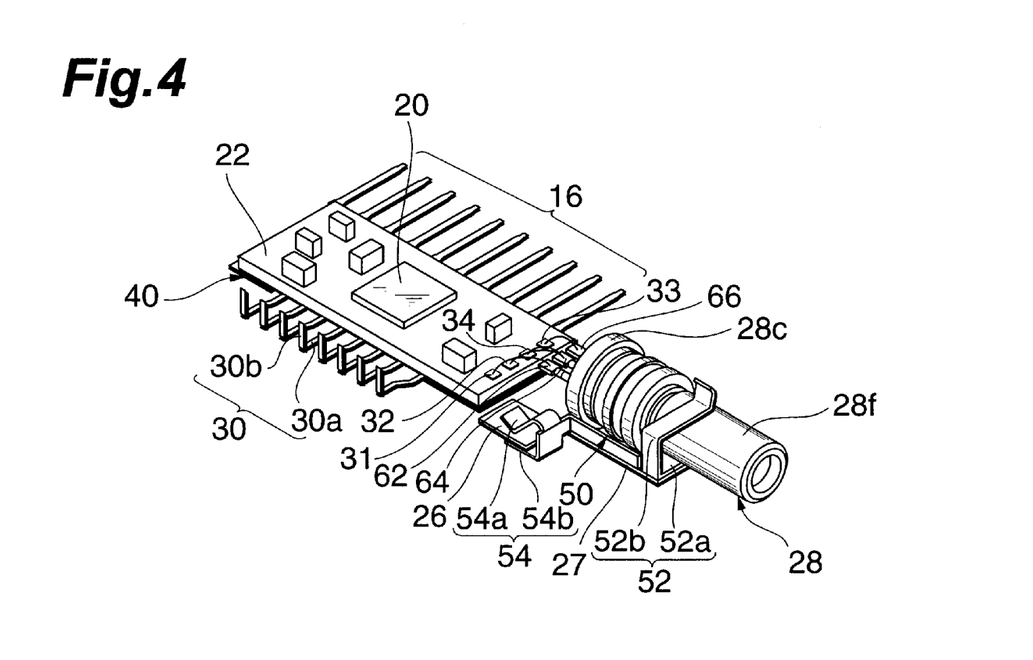
FIG. 4 is a perspective view showing the assembled state of FIG. 2.
Figure 5:
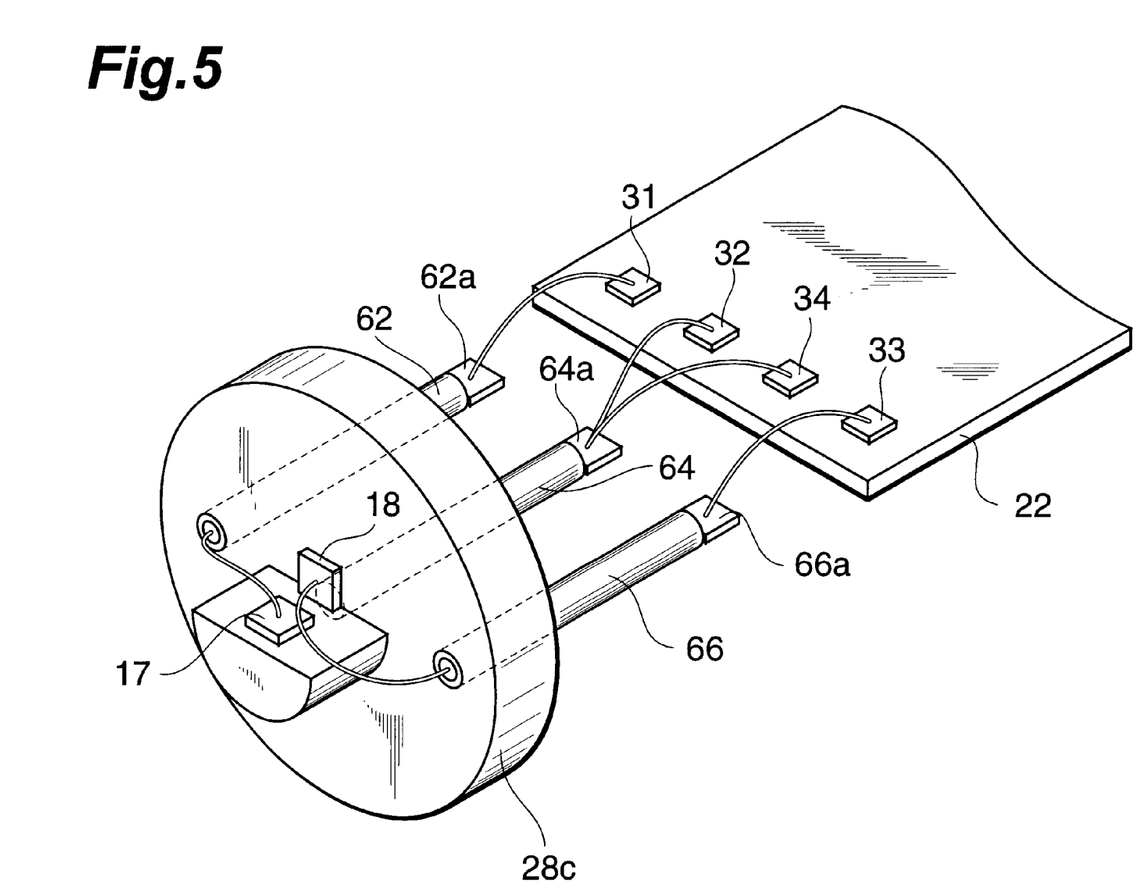
FIG. 5 is a view schematically showing the state of wire bonding between the connection pins and pads on the internal board in FIGS. 2 and 4.

In the transmission optical module 10 in accordance with this embodiment, the electronic device 20 is mounted on the island 24 of the lead frame 40 on the internal board as shown in FIG. 4. Also, the grasping part 54 of the holding member 50 grasps the support part 26 of the lead frame 40, whereby the holding member 50 is supported. Here, the auxiliary part 27 of the lead frame 40 assists in supporting the holding member 50. The light-emitting device assembly 28 is held on the holding member 50 with the holding part 52. In this state, wires bond between a plurality of connection pins 62 to 66 extending from the base 28c of the light-emitting device assembly 28 and the pads 31 to 34 on the internal board 22. FIG. 5 is a view schematically showing the state of wire bonding between the connection pins 62 to 66 and the pads 31 to 34 on the internal board 22. As shown in FIG. 5, among the plurality of connection pins 62 to 66 extending from the base 28c, the connection pin 62 connected to the cathode of the light-emitting device 17 is connected to the pad 31 on the internal board 22 by wire bonding, whereas the connection pin 66 connected to the cathode of the photodiode 18 is connected to the pad 33 on the internal board 22 by wire bonding. From the connection pin 64 connected to the anode of the light-emitting device 17 and the cathode of the photodiode 18, wires extend to both of the pad 32 and the pad 34 for supplying the source voltage respectively, so as to establish electric connection.

For constructing the optical module body 12, the light-emitting device assembly 28, the internal board 22 on which the electronic device 20 is mounted, the lead frame 40 including the island 24, first lead array 16, second lead array 30, and support part 26, and the holding member 50 are encapsulated with a resin.

In the first lead array 16, as shown in FIG. 1, only one end is encapsulated with the resin, whereas the other end projects from the mold resin 11. In the second lead array 30, on the other hand, only the base part 30a is encapsulated with the resin, whereas the bent part 30b bent at a predetermined angle with respect to the base part 30a projects from the mold resin 11. In the sleeve 28f of the light-emitting device assembly 28, only one end is encapsulated with the resin, whereas the other end projects from the mold resin 11.

Therefore, the optical module body 12 has a substantially square pole form with two side faces, parallel to the resin-encapsulated internal board 22, extending along the optical axis X, and two side faces, perpendicular to the internal board 22, from which the first lead array 16 and the second lead array 30 project, respectively.

As shown in FIG. 1, one of the two side faces of the optical module body 12 parallel to the internal board 22 is formed with a support projection 41 for supporting the lower side 14b of the external board 14. The bent part 30b of the second lead array 30 is bent toward the support projection 41, so as to be soldered to bonding pads provided on the rear face of the external board 14. Therefore, the external board 14 can be secured when the lower side 14b of the external board 14 is mounted on the support projection 41 while the bent part 30b of the second lead array 30 is soldered to the bonding pads on the rear face of the external board 14.

As shown in FIG. 1, the external board 14 is constituted by a printed board having an area equal to the internal board 22, and two volumes 44 mounted thereon. One of the two volumes 44 is used for adjusting the optical output from the light-emitting device 17 of the resin-encapsulated light-emitting device assembly 28, whereas the other is used for adjusting the bias current supplied to the light-emitting device 17 of the light-emitting device assembly 28. Eight bonding pads are formed on the rear face of the external board 14 at respective positions corresponding to the eight lead pins of the second lead array 30, so as to function as terminals for electrically connecting the optical module body 12 to the external board 14.

The lower side 14b is supported by the support projection 41 on a side face of the optical module body 12, the bonding pads on the rear face are soldered to the bent parts 30b of the second lead array 30, and so forth, whereby the external board 14 is secured to the optical module body 12.

Output characteristics of the transmission optical module 10 in accordance with this embodiment will now be explained in comparison with those of the above-mentioned conventional transmission optical module.

When a source voltage $V_{CC}$ is supplied to the light-emitting device 17 through the connection pin 64 and the pad 34 for supplying the source voltage, the transmission optical module 10 in accordance with this embodiments outputs signal light having a predetermined characteristic.

Figure 6A:
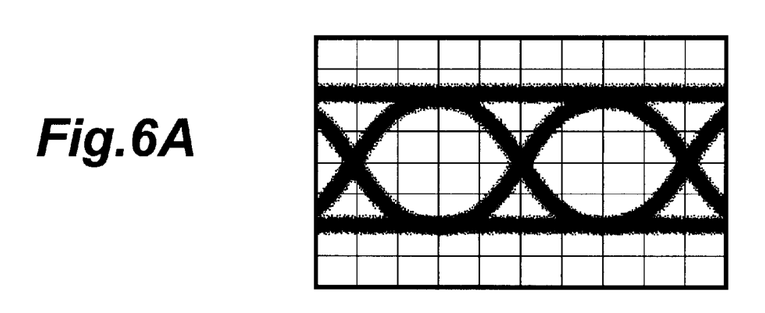
FIGS. 6A to 6C are charts comparing the stability of waveform of signal light outputted from the transmission optical module in accordance with an embodiment of the present invention (FIGS. 6A and 6C) with that in a conventional transmission optical module (FIG. 6B)
Figure 6B:
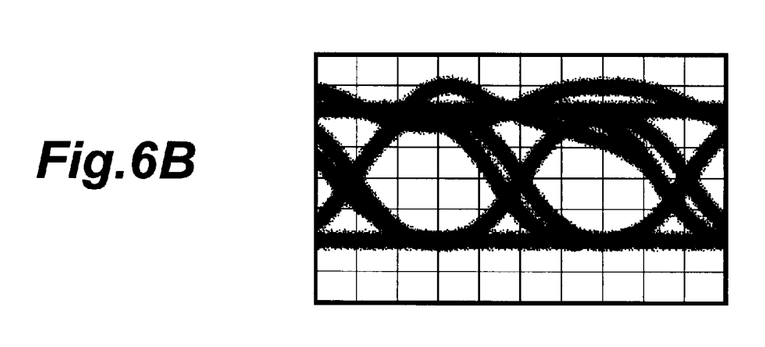

FIG. 6A is a chart showing an example of waveform of the signal light outputted from the transmission optical module 10 in accordance with this embodiment. As shown, the signal light outputted from the transmission optical module 10 in accordance with this embodiment shows a stable waveform. By contrast, the waveform of signal light outputted from the conventional transmission optical module shown in FIG. 8 in which the source voltage $V_{CC}$ is supplied to the light-emitting device through the lead frame, holding member, and sleeve is disturbed as shown in FIG. 6B.

Figure 7:
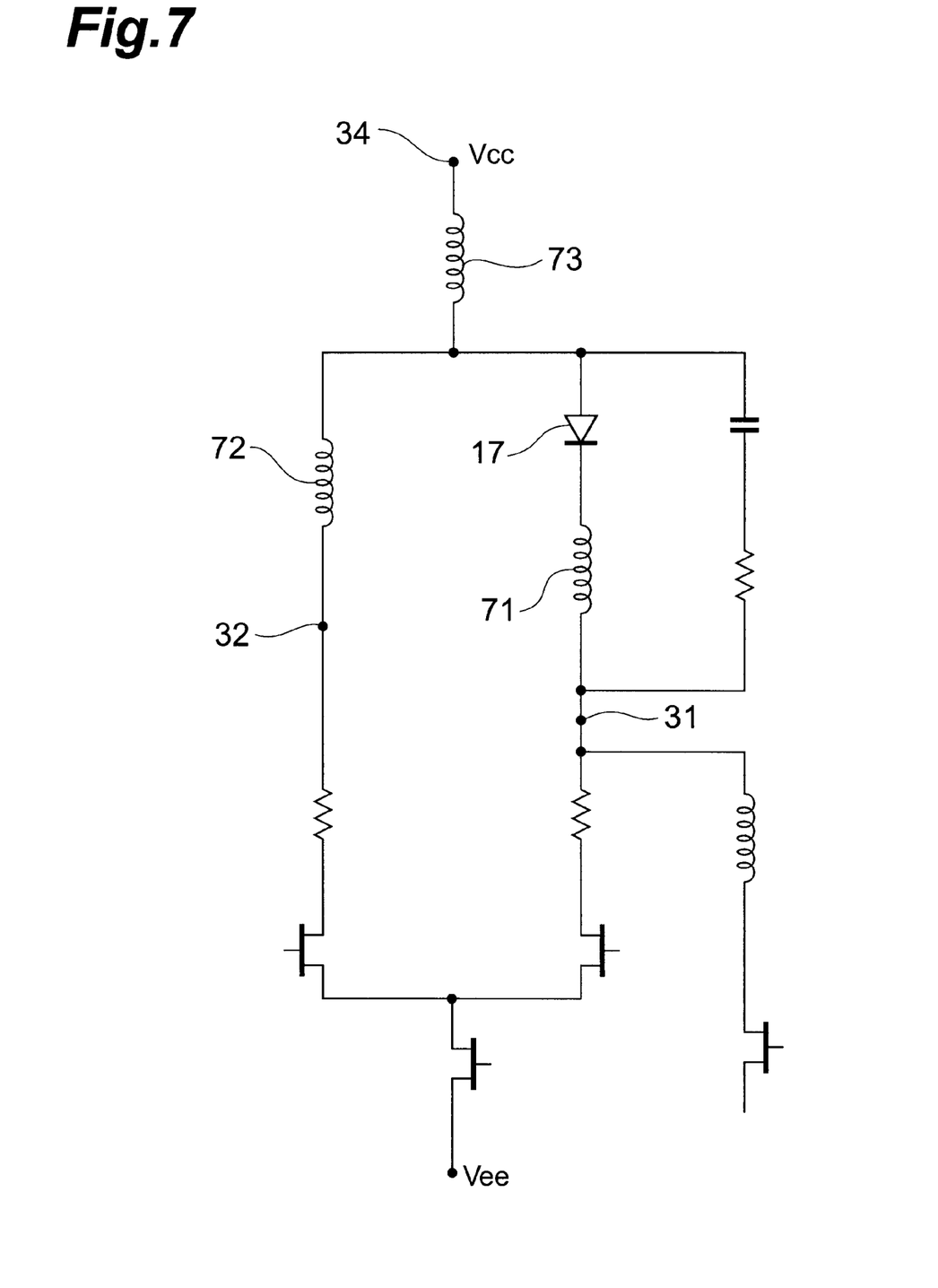
FIG. 7 is a circuit diagram equivalent to the transmission module in accordance with the embodiment.

The reason why the waveform of signal light outputted from the transmission optical module 10 in accordance with this embodiment becomes more stable than that in the conventional transmission optical module will now be studied with reference to FIG. 7. FIG. 7 is a circuit diagram equivalent to the transmission optical module 10 in accordance with this embodiment.

As shown, the source voltage $V_{CC}$ is supplied to the anode of the light-emitting device 17 from the pad 34 for supplying the source voltage. Here, since wires bond the connection pin 64 to both of the pads 32, 34, inductances 72, 73 occur. Also, since wire bonds the connection pin 62 to the pad 31, an inductance 71 occurs.

Since the source voltage $V_{CC}$ is supplied to the light-emitting device 17 through the wire-bonded connection pin 64 and pad 34, the source voltage supplying path is shortened, so that the inductance 73 becomes smaller, whereby the waveform of signal light outputted from the light-emitting device 17 is stabilized. In the conventional transmission optical module, by contrast, the source voltage $V_{CC}$ is supplied to the light-emitting device through the lead frame, holding member, and sleeve, so that the source voltage supplying path is elongated, which enhances the inductance, whereby the waveform of signal light outputted from the light-emitting device becomes unstable.

Thus, the transmission optical module 10 in accordance with this embodiment can reduce the inductance in a path for supplying a source voltage, whereby the waveform of signal light outputted from the light-emitting device 17 can be stabilized.

Figure 6C:
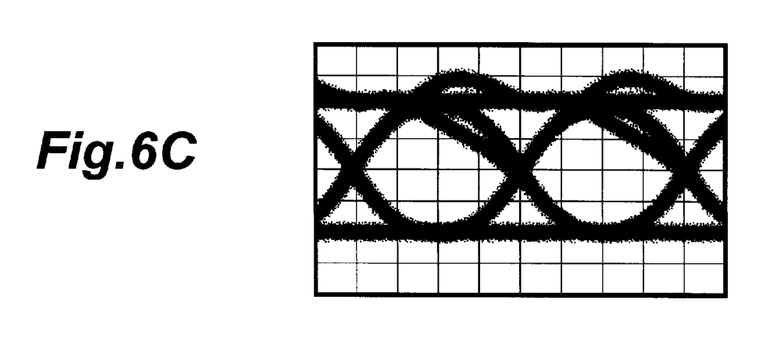

Here, FIG. 6C is a chart showing the waveform of signal light outputted from the light-emitting device 17 in the case where the source voltage $V_{CC}$ is supplied to the light-emitting device 17 not only through the pad 34 for supplying the source voltage and the connection pin 64 (first path) but also through the lead frame 40, holding member 50, and sleeve 28c (second path) while connecting the island 24 and support part 26 of the lead frame 40 to each other in the transmission optical module 10 in accordance with this embodiment.

From the viewpoint of reliably supplying the source voltage $V_{CC}$ in a stable manner, it is desirable that the source voltage $V_{CC}$ be supplied to the light-emitting device 17 from both of the first and second paths. In this case, however, a delay occurs between the first and second paths although the waveform of signal light becomes more stable than that in the conventional transmission optical module shown in FIG. 6B, whereby the stability in waveform of signal light becomes inferior to that in the case of FIG. 6A in which the source voltage $V_{CC}$ is supplied from the first path alone.

Therefore, the waveform of signal light can further be stabilized when the source voltage $V_{CC}$ is supplied to the light-emitting device 17 from the first path alone.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A transmission optical module comprising:

a light-emitting device assembly having a light-emitting device, a case for accommodating said light-emitting device, and a connection pin extending outward from said case and electrically connected to an anode of said light-emitting device;

a circuit board, on which an electronic device for controlling said light-emitting device is mounted, and having a first pad to which a predetermined potential is applied and a second pad for supplying a source voltage;

a lead frame having a board mounting part for mounting said circuit board; and wires bonding said connection pin to said first pad and second pads respectively.

2. A transmission optical module according to claim 1, wherein said source voltage is supplied to said light-emitting device from said second pad alone.

3. A transmission optical module according to claim 1, where in said light-emitting device assembly, said circuit board, and said lead frame are encapsulated with a resin.

* * * * *